(12) United States Patent
Aeling et al.

(10) Patent No.: US 9,404,637 B2
(45) Date of Patent: Aug. 2, 2016

(54) COLOR SHIFT SIGN

(71) Applicant: 3M INNOVATIVE PROPERTIES COMPANY, St. Paul, MN (US)

(72) Inventors: Ellen O. Aeling, Oakdale, MN (US); Michael A. Meis, Stillwater, MN (US); John T. Simpson, Lake Elmo, MN (US); Joseph A. Hoffman, Minneapolis, MN (US); Paul E. Humpal, Stillwater, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 14/364,248

(22) PCT Filed: Dec. 7, 2012

(86) PCT No.: PCT/US2012/068355
§ 371 (c)(1),
(2) Date: Jun. 10, 2014

(87) PCT Pub. No.: WO2013/095950
PCT Pub. Date: Jun. 27, 2013

(65) Prior Publication Data
US 2014/0334127 A1    Nov. 13, 2014

Related U.S. Application Data

(60) Provisional application No. 61/577,170, filed on Dec. 19, 2011.

(51) Int. Cl.
*F21V 9/16* (2006.01)
*F21V 9/08* (2006.01)
(Continued)

(52) U.S. Cl.
CPC ... *F21V 9/08* (2013.01); *F21K 9/56* (2013.01); *G09F 13/04* (2013.01); *G09F 13/16* (2013.01);
(Continued)

(58) Field of Classification Search
CPC ............. F21V 9/08; F21V 9/10; G09F 13/16; G09F 13/04; F21K 9/56; F21Y 2103/00; F21Y 2101/02; H01L 27/322; H01L 27/3237; H01L 51/5262
See application file for complete search history.

(56) References Cited

U.S. PATENT DOCUMENTS 5,329,435 A    7/1994  McGuire
7,084,435 B2   8/2006  Sugimoto
(Continued)

FOREIGN PATENT DOCUMENTS

CN    2355206      12/1999
CN    101765800    6/2010
(Continued)

OTHER PUBLICATIONS

International Search Report for PCT International Application No. PCT/US2012/068355, mailed on Mar. 28, 2013, 3pgs.
(Continued)

*Primary Examiner* — Anne Hines
*Assistant Examiner* — Jose M Diaz
(74) *Attorney, Agent, or Firm* — Emily M. Van Vliet; Steven A. Bern

(57) ABSTRACT

The present application is directed to an illumination device comprising a recycling cavity defined by recycling surfaces and a light emission surface; a light source within the cavity. A spectrum modifying layer is on a portion of the recycling surface, the spectrum modifying layer producing a spectral response different from the spectral response of the recycling surface. In some embodiments, the spectrum modifying layer shifts the spectral properties of the light being emitted from the light emission area from the spectral properties of the light source. In some embodiments, the spectrum modifying layer selectively absorbs a portion of light along the light source spectrum. In some embodiments, the spectrum modifying layer re-emits light at a wavelength longer than the wavelength it absorbed.

25 Claims, 2 Drawing Sheets

(51) Int. Cl.
- G09F 13/04 (2006.01)
- F21K 99/00 (2016.01)
- G09F 13/16 (2006.01)
- H01L 51/52 (2006.01)
- H01L 27/32 (2006.01)
- F21V 9/10 (2006.01)
- F21Y 101/02 (2006.01)
- F21Y 103/00 (2016.01)

(52) U.S. Cl.
CPC ............... *F21V 9/10* (2013.01); *F21Y 2101/02* (2013.01); *F21Y 2103/00* (2013.01); *H01L 27/322* (2013.01); *H01L 27/3237* (2013.01); *H01L 51/5262* (2013.01)

(56) References Cited

U.S. PATENT DOCUMENTS

| | | | |
|---|---|---|---|
| 7,242,447 | B2 | 7/2007 | Nakano |
| 7,345,318 | B2 | 3/2008 | Okuwaki |
| 8,847,481 | B2 * | 9/2014 | Park et al. ............ 313/506 |
| 2002/0002783 | A1 * | 1/2002 | Araki et al. ............ 40/447 |
| 2005/0035331 | A1 * | 2/2005 | Sun ................. C09J 7/0296 252/301.5 |
| 2007/0291494 | A1 | 12/2007 | Galli |
| 2008/0089096 | A1 | 4/2008 | Lin |
| 2008/0094689 | A1 | 4/2008 | Van Gorkom |
| 2009/0236967 | A1 | 9/2009 | Yokoyama |
| 2010/0033948 | A1 | 2/2010 | Harbers |
| 2010/0053625 | A1 * | 3/2010 | Lee et al. ............ 356/445 |
| 2010/0142182 | A1 * | 6/2010 | Van Woudenberg et al. ... 362/84 |
| 2010/0195307 | A1 | 8/2010 | Bollmann |
| 2011/0064912 | A1 * | 3/2011 | Kaufmann ............ 428/141 |
| 2011/0169410 | A1 * | 7/2011 | Dassanayake et al. ......... 315/82 |
| 2012/0154917 | A1 | 6/2012 | Teather |
| 2012/0262902 | A1 * | 10/2012 | Pickard et al. .......... 362/84 |
| 2013/0126917 | A1 * | 5/2013 | Kitai et al. ............ 257/88 |
| 2013/0148357 | A1 * | 6/2013 | Johnston et al. ............ 362/253 |
| 2013/0334956 | A1 * | 12/2013 | Bretschneider ............ 313/498 |

FOREIGN PATENT DOCUMENTS

| | | |
|---|---|---|
| JP | 2001 092392 | 4/2001 |
| JP | 2003-075645 | 3/2003 |
| JP | 2003-110146 | 4/2003 |
| JP | 2005-064111 | 3/2005 |
| JP | 2005-166733 | 6/2005 |
| JP | 3 690852 | 8/2005 |
| JP | 2006-019598 | 1/2006 |
| JP | 2009 036989 | 2/2009 |
| KR | 2005-0009955 | 1/2005 |
| WO | WO 2009013695 | 1/2009 |

OTHER PUBLICATIONS

EP 12 86 0013 Search Report, dated Jul. 15, 2015.

* cited by examiner

COLOR SHIFT SIGN

CROSS REFERENCE TO RELATED APPLICATIONS

This application is a national stage filing under 35 U.S.C. 371 of PCT/US2012/068355, filed Dec. 7, 2012, which claims priority to U.S. Provisional Application No. 61/577,170, filed Dec. 19, 2011, the disclosure of which is incorporated by reference in its/their entirety herein.

BACKGROUND

There are a number of major types of illuminated sign technologies presently in use. One potential problem with illumination signs using LEDs, is that the available visible color spectrum is limited by the finite availability of LED colors. It has been known to use an illumination device that uses one or more fluorescent and/or phosphorescent dyes to provide for emission of light in colors that cannot ordinarily be achieved by the use of LEDs alone, including the ability to control and change the color of the emitted light. However, such an illumination device is complicated.

SUMMARY

It is desirable to modify the spectrum of an LED. The present application is directed to an illumination device comprising a recycling cavity defined by recycling surfaces and a light emission surface; a light source within the cavity. A spectrum modifying layer is on a portion of the recycling surface, the spectrum modifying layer producing a spectral response different from the spectral response of the recycling surface. In some embodiments, the spectrum modifying layer shifts the spectral properties of the light being emitted from the light emission area from the spectral properties of the light source. In some embodiments, the spectrum modifying layer selectively absorbs a portion of light along the light source spectrum. In some embodiments, the spectrum modifying layer re-emits light at a wavelength longer than the wavelength it absorbed.

The present application is also directed to a method of modifying the spectral response of a light box comprising providing an illumination device comprising a recycling cavity defined by surfaces, and placing a spectrum modifying layer on at least a portion of the surface of the recycling cavity, wherein the spectrum modifying layer produces a first spectral response different from the spectral response of the surface of the recycling cavity, wherein the modified spectral response of the light box is determined by the area covered by the spectrum modifying layer.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

As used herein, when an element, component or layer for example is described as being "on" "connected to", "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as begin "directly on", "directly connected to", "directly coupled with", or "directly in contact with" another element, there are no intervening elements, components or layers for example.

Figure 1:
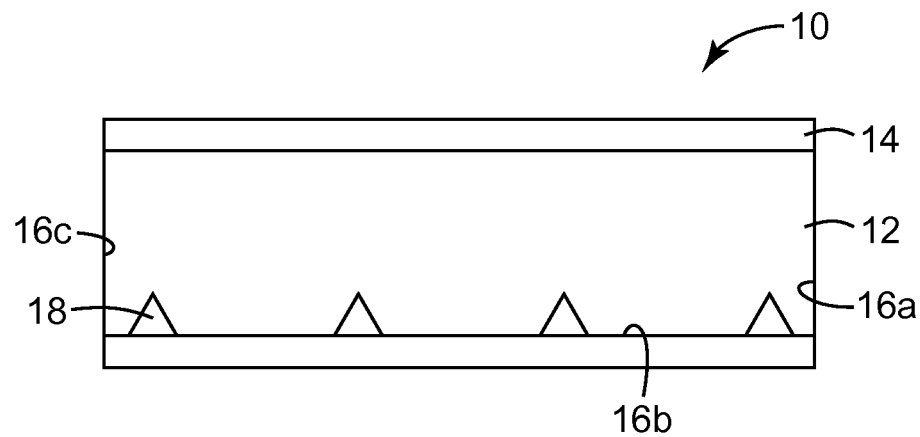
FIG. 1 is a cross sectional view of an illumination device.

FIG. 1 illustrates a cross section view of an illumination device, for reference. The illumination device 10 has a recycling cavity 12. The recycling cavity 12 is defined by a light emission surface 14 and recycling surfaces 16(a, b and c). A light source 18 sits on one of the recycling surfaces, for example the surface 16b opposite the light emission surface 14. However, the light source may be on any recycling surface.

Figure 2:
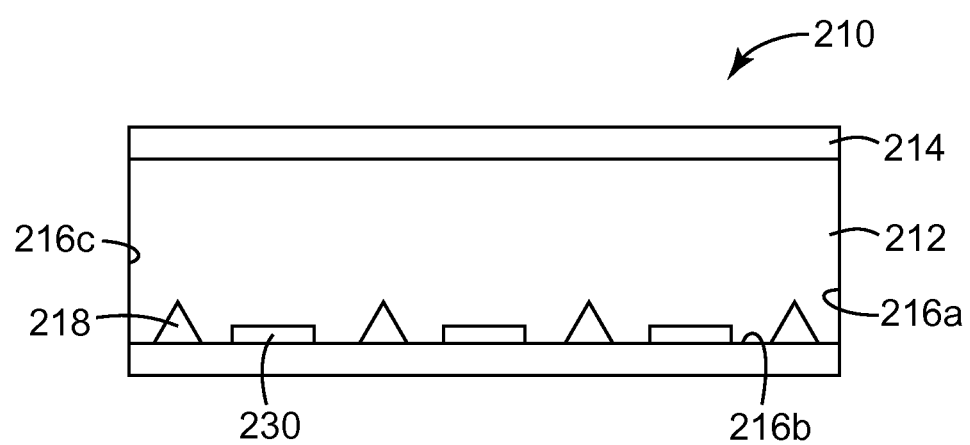
FIG. 2 is a cross sectional view of an illumination device according to one embodiment the present application.

FIG. 2 illustrates a cross section view of an illumination device according to one embodiment of the present application. The illumination device 210 has a recycling cavity 212. The recycling cavity 212 is defined by a light emission surface 214 and recycling surfaces 216(a, b and c). A light source 218 sits on one of the recycling surfaces 216b. The light source 218 is an array of multiple light sources in some embodiments, such as shown in FIGS. 1 and 2. A spectrum modifying layer 230 additionally sits on the recycling surface 216b between the light sources 218. The spectrum modifying layer may be on any of the recycling surfaces 216 (a, b or c).

Figure 3:
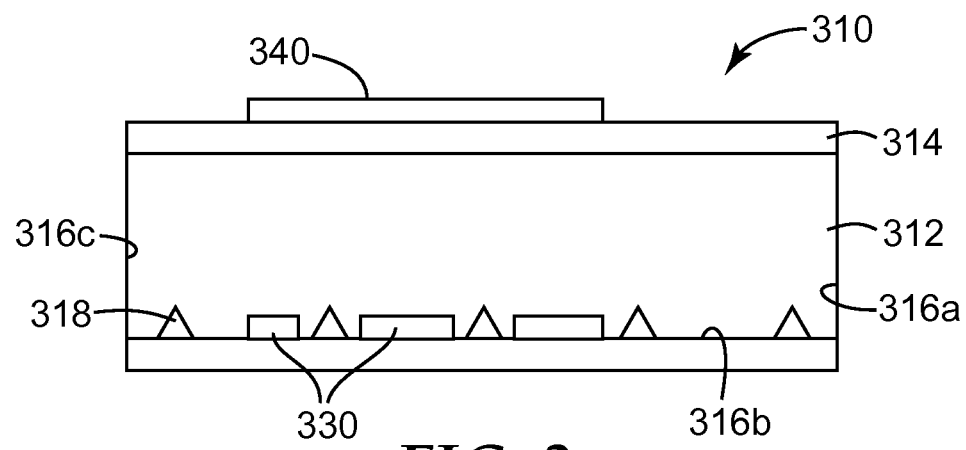
FIG. 3 is an elevated view of an illumination device according to another embodiment the present application.

FIG. 3 illustrates a cross section view of an illumination device according to another embodiment of the present application. The illumination device 310 has a recycling cavity 312. The recycling cavity 312 is defined by a light emission surface 314 and recycling surfaces 316(a, b and c). A light source 318 sits on one of the recycling surfaces 316b. A spectrum modifying layer 330 additionally sits on the recycling surface 316b between a selection of the light sources 318. An image 340 is on the light emission surface 314 opposite the recycling cavity 312. The spectrum modifying layer 330 is placed on the recycling surface is relation to the image 340. For example, the image is a gold fish on a blue background. The light from the light source 318 may then be modified only with respect to the light behind the gold fish. Specifically, the light behind the fish will be made "warmer" or more red, and the light behind the blue background can remain "cooler".

Illumination Device

An illumination device is generally a light emitting object. Specific examples include a luminaire, or an illuminated sign. Illuminated signs, sometimes referred to as light boxes or sign boxes, are often used to enhance the presentation of images and/or text. Examples of illuminated signs can be found in, e.g., airports, mass-transit stations, shopping malls and other public places. The illumination device comprises a recycling cavity defined by recycling surfaces and a light emission surface. In a sign box application, the recycling cavity is an enclosure having an illuminated face over which a graphic (including images and/or text) is located, which is the light emission surface. The illumination is typically provided by light sources located behind the sign face and within the enclosure. The images and/or text in the graphic typically include transparent or translucent portions to enhance their visibility when placed over the illuminated face.

Recycling Cavity

The present illumination source has a recycling cavity defined by recycling surfaces and a light emission surface. Generally, the recycling cavity is enclosed by the defining surfaces. The recycling cavity serves the purpose of reflecting light that did not pass through the light emission surface.

Recycling Surface

The recycling surface in the recycling cavity. Any surface that reflects over 50% of light can be used, for example over 60% and in specific examples over 80%. For example, the surface can be a white surface.

Light Emission Surface

The light emission surface emits light from the cavity. In a sign box application, the light emission surface will generally contain the graphic. Generally, the light emission surface will transmit at least 20% of the light in a first pass, generally between about 20% and about 40%. Reflected light is then returned to the recycling cavity Examples of suitable light emission surface materials include diffusers, microreplicated sheet, a lens or partially transmitting mirrors.

Light Source

Any light emitting source can be used for the present application. Specifically, LED light sources are used. LED's come in varying colors, red, amber, greens, blues and whites. White LED's with more light in the red region of visible spectra are warmer color temperature and the white LED's with more blue light are cooler color temperature. White LED's in the cooler color temperatures (5000 to 10000K) are far more available, brighter and efficient than warmer whites (2500 to 5000 K). Generally, the cooler the color temperature of a white LED, the more energy efficient the LED. Other specific examples of a light source include fluorescent bulbs, OLEDS and electroluminescent layers.

Spectrum Modifying Layer

The spectrum modifying layer is placed on a portion of the recycling surface. The spectrum modifying layer produces a spectral response different from the spectral response of the recycling surface on the recycled light within the cavity. The spectrum modifying layer may shift the spectral properties of the light being emitted from the light emission area to be different from the spectral properties of the light source. In some embodiments, the spectrum modifying layer selectively absorbs a portion of light along the light source spectrum, and reflects the rest of the light. In some embodiments, the spectrum modifying layer selectively absorbs a portion of light along the light source spectrum, and remits the light at a different wavelength. In such an embodiment, the spectrum modifying layer re-emits light at a wavelength longer than the wavelength it absorbed.

Generally, the spectrum modifying layer is a film containing a dye or pigment in the film, for example a colored film. The spectrum modifying layer may also be an ink layer. The spectrum modifying layer may include a fluorescent material, a phosphorescent material, or the like. In some embodiments, the spectrum modifying layer absorbs wavelengths below 550 nm. In other embodiments, the spectrum modifying layer absorbs wavelengths above 600 nm.

In some embodiments, the spectrum modifying layer is an adhesive backed film, such as a tape.

EXAMPLES

This example is merely for illustrative purposes and is not meant to be limiting on the scope of the appended claims.

Figure 4:
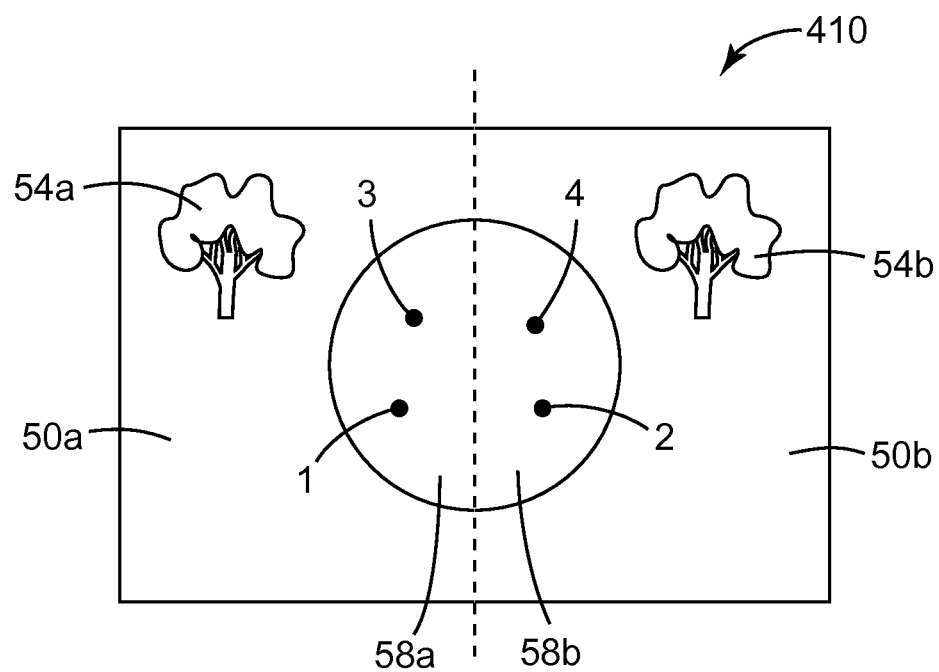
FIG. 4 is a front side view of an illumination device according to the Examples herein.

A sign box was internally lit in the chamber with Sloan LED's split in ½ (Sloan 12 volt VL Plus 701269-WVLL-MB). The sign box was lined with a reflective film (3M Light Enhancement Film 3635-100) in the interior chamber, creating a light recycling surface. A graphic was added over the face, so that the interior chamber was a recycling cavity. FIG. 4 is a reference figure for the present example. The sign box 410 has a light emission surface with two sides 50a and 50b. The image is of a person 58 (slit in two as 58a and 58b) with a nature scene behind 54a and 54b.

One half of the interior chamber behind side 50a recycling cavity, the surface was lined with polycarbonate films with 0.3% of a fluorescent dye as a spectrum modifying layer. The list of fluorescent dyes used in each example is listed in Table 1. Spots 1 and 3 were measured on side 58a, the graphic over the fluorescent dyed film. Spots 2 and 4 were measured on side 58b, the graphic over the side with no dyed film in relatively the same location from the light and relatively the same color on the image. Brightness and Color Temperature were measured and the results are shown below.

| | Spot 1 | | Spot 2 | | Spot 3 | | Spot 4 | |
|---|---|---|---|---|---|---|---|---|
| Film | Brightness cd/m2 | Color Temperature | Brightness cd/m2 | Color Temperature | Brightness cd/m2 | Color Temperature | Brightness cd/m2 | Color Temperature |
| None | 131 | 4262.63 | 136 | 4524.57 | 144 | 4486.59 | 162 | 4550.57 |
| Colorplast orange 63 | 121 | 3326.58 | | | 130 | 2993.59 | | |
| BASF Lumogen F Orange 240 | 124 | 3363.45 | | | 135 | 3253.77 | | |
| Solvent Yellow 98 | 151 | 4081.42 | | | 136 | 4004.24 | | |

Various modifications and alterations of the present invention will become apparent to those skilled in the art without departing from the spirit and scope of the invention.

What is claimed is:

1. An illumination device comprising
   a recycling cavity defined by recycling surfaces and a light emission surface, wherein the light emission surface is a partial mirror;
   a light source within the cavity; and
   a spectrum modifying layer on a portion of the recycling surface, the spectrum modifying layer producing a spectral response different from the spectral response of the recycling surface, and wherein the spectrum modifying layer is a phosphorescent material.

2. The device of claim 1 wherein the spectrum modifying layer shifts the spectral properties of the light being emitted from the light emission area from the spectral properties of the light source.

3. The device of claim 1 wherein the spectrum modifying layer selectively absorbs a portion of light along the light source spectrum.

4. The device of claim 3 wherein the spectrum modifying layer re-emits light at a wavelength longer than the wavelength it absorbed.

5. The device of claim 4 wherein the spectrum modifying layer is a fluorescent material.

6. The device of claim 3 wherein the spectrum modifying layer is a colored layer.

7. The device of claim 3 wherein the spectrum modifying layer absorbs wavelengths below 550 nm.

8. The device of claim 3 wherein the spectrum modifying layer absorbs wavelengths above 600 nm.

9. The device of claim 1 wherein the spectrum modifying layer is an ink layer.

10. The device of claim 1 wherein the spectrum modifying layer is a tape.

11. The device of claim 1 wherein the spectrum modifying layer is a film.

12. The device of claim 1 wherein the light emission surface is a diffuser.

13. The device of claim 1 wherein the light emission surface is a microreplicated sheet.

14. The device of claim 1 wherein the light source is an LED.

15. The device of claim 1 wherein the light source is a fluorescent bulb.

16. The device of claim 1 wherein the light source is an OLED.

17. The device of claim 1 wherein the light source is an electroluminescent layer.

18. An illumination device comprising
    a recycling cavity defined by recycling surfaces and a light emission surface;
    a light source within the cavity; and
    a spectrum modifying layer on a portion of the recycling surface, the spectrum modifying layer producing a spectral response different from the spectral response of the recycling surface, and wherein the light emission surface is a partial mirror.

19. The device of claim 18 wherein the spectrum modifying layer selectively absorbs a portion of light along the light source spectrum.

20. The device of claim 18 wherein the spectrum modifying layer shifts the spectral properties of the light being emitted from the light emission area from the spectral properties of the light source.

21. The device of claim 20 wherein the spectrum modifying layer re-emits light at a wavelength longer than the wavelength it absorbed.

22. The device of claim 21 wherein the spectrum modifying layer is a fluorescent material.

23. The device of claim 18 wherein the spectrum modifying layer is a colored layer.

24. The device of claim 21 wherein the spectrum modifying layer absorbs wavelengths below 550 nm.

25. The device of claim 18 wherein the spectrum modifying layer absorbs wavelengths above 600 nm.

* * * * *